US010991847B2

(12) United States Patent
Steiner et al.

(10) Patent No.: US 10,991,847 B2
(45) Date of Patent: Apr. 27, 2021

(54) SEMICONDUCTING DEVICES CONTAINING QUANTUM WELLS

(71) Applicant: Alliance for Sustainable Energy, LLC, Golden, CO (US)

(72) Inventors: Myles Aaron Steiner, Denver, CO (US); Ryan Matthew France, Golden, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 0 days.

(21) Appl. No.: 16/734,994

(22) Filed: Jan. 6, 2020

(65) Prior Publication Data

US 2020/0235262 A1      Jul. 23, 2020

Related U.S. Application Data

(60) Provisional application No. 62/793,945, filed on Jan. 18, 2019.

(51) Int. Cl.
| | | |
|---|---|---|
| *H01L 33/06* | (2010.01) | |
| *H01L 31/0352* | (2006.01) | |
| *H01L 29/207* | (2006.01) | |
| *H01S 5/343* | (2006.01) | |
| *H01L 33/30* | (2010.01) | |

(52) U.S. Cl.
CPC ............ *H01L 33/06* (2013.01); *H01L 29/207* (2013.01); *H01L 31/035236* (2013.01); *H01L 33/305* (2013.01); *H01S 5/34313* (2013.01)

(58) Field of Classification Search
CPC ....... H01L 31/035236; H01L 31/03046; H01L 31/0735; H01L 29/207; H01L 29/0804; H01L 29/165; H01L 29/267; H01L 33/06; H01L 33/305; H01L 33/0004; H01L 33/0062; H01S 5/34313; H01S 5/34306; H01S 5/0262; H01S 5/3407; Y02E 10/544; Y02E 10/50; Y02E 10/543
See application file for complete search history.

(56) References Cited

U.S. PATENT DOCUMENTS

| | | | | |
|---|---|---|---|---|
| 4,255,211 | A * | 3/1981 | Fraas | ................ H01L 31/0687 136/249 |
| 4,396,931 | A * | 8/1983 | Dumke | ............... H01L 29/7606 257/105 |
| 4,927,471 | A * | 5/1990 | Okuda | ................ H01L 21/0262 148/33.5 |
| 5,479,032 | A * | 12/1995 | Forrest | ................ H01L 27/1465 257/184 |
| 5,719,895 | A * | 2/1998 | Jewell | ................... B82Y 20/00 257/15 |

(Continued)

OTHER PUBLICATIONS

Sze, Modern Semiconductor Device Physics, 1998, John Wiley & Sons, pp. 539-540 (Year: 1998).*

(Continued)

*Primary Examiner* — Nikolay K Yushin
(74) *Attorney, Agent, or Firm* — Michael A. McIntyre

(57) ABSTRACT

The present disclosure relates to a device that includes, in order, an emitter layer, a quantum well, and a base layer, where the emitter layer has a first bandgap, the base layer has a second bandgap, and the first bandgap is different than the second bandgap by an absolute difference greater than or equal to 25 meV.

14 Claims, 6 Drawing Sheets

(56) References Cited

U.S. PATENT DOCUMENTS 6,147,296 A * 11/2000 Freundlich ............ H01L 31/077
136/255
7,119,271 B2 * 10/2006 King ................ H01L 31/02168
136/252

OTHER PUBLICATIONS

Hussein et al, "First principle study of electronic nanoscale structure of InxGa1-xP with variable size, shape and alloying percentage", 2013, Indian J Phys. (Nov. 2013) 87(11) pp. 1079-1085, published Jun. 21, 2013 (Year: 2013).*
"GaAs1-xPx" (Year: 2021).*
Alonso-Alvarez, D. et al., "Solcore: a multi-scale, Python-based library for modeling solar cells and semiconductor materials," Journal of Computational Electronics, vol. 17, 2018, pp. 1099-1123.
Ekins-Daukes, N.J. et al., "Strain-balanced GaAsP/InGaAs quantum well solar cells," Applied Physics Letters, vol. 75, No. 26, Dec. 27, 1999, 3 pages.
Ekins-Daukes, N.J. et al., "Strain-Balanced Criteria for Multiple Quantum Well Structures and Its Signature in X-Ray Rocking Curves," Crystal Growth and Design, vol. 2, No. 4, 2002, pp. 287-292.
Geisz, J.F. et al., "Enhanced external radiative efficiency for 20.8% efficient single-junction GaInP solar cells," Applied Physics Letters, vol. 103, 2013, 5 pages.
Steiner, M.A. et al., "Optical enhancement of the open circuit voltage in high quality GaAs solar cells," Journal of Applied Physics, vol. 113, 2013, 11 pages.

* cited by examiner

SEMICONDUCTING DEVICES CONTAINING QUANTUM WELLS

CROSS-REFERENCE TO RELATED APPLICATION

This application claims priority from U.S. Provisional Patent Application No. 62/793,945 filed Jan. 18, 2019, the disclosure of which is incorporated herein by reference in its entirety.

CONTRACTUAL ORIGIN

This invention was made with government support under Contract No. DE-AC36-08GO28308 awarded by the Department of Energy. The government has certain rights in the invention.

SUMMARY

An aspect of the present disclosure is a device that includes, in order, an emitter layer, a quantum well, and a base layer, where the emitter layer has a first bandgap, the base layer has a second bandgap, and the first bandgap is different than the second bandgap by an absolute difference greater than or equal to 25 meV. In some embodiments of the present disclosure, the quantum well may include a well layer positioned between a first barrier layer and a second barrier layer.

In some embodiments of the present disclosure, the absolute difference may be between about 25 meV and about 100 meV. In some embodiments of the present disclosure, the absolute difference may be between about 25 meV and about 50 meV. In some embodiments of the present disclosure, the emitter layer may include silicon-doped GaAs. In some embodiments of the present disclosure, the base layer may include zinc-doped GaInP. In some embodiments of the present disclosure, the well layer may include undoped GaInAs. In some embodiments of the present disclosure, the first barrier layer and the second barrier layer may each include undoped GaAsP.

In some embodiments of the present disclosure, the first bandgap may be between about 1.0 eV and about 1.5 eV. In some embodiments of the present disclosure, the first bandgap may be about 1.4 eV. In some embodiments of the present disclosure, the second bandgap may be between about 1.0 eV and about 2.2 eV. In some embodiments of the present disclosure, the second bandgap may be about 1.8 eV. In some embodiments of the present disclosure, the emitter layer may have a thickness between 0.5 µm and about 2 µm. In some embodiments of the present disclosure, the base layer may have a thickness between about 0.05 µm and about 0.2 µm. In some embodiments of the present disclosure, the device may include at least one of a solar cell, a transistor, a light-emitting diode, a laser, and/or a sensor.

DRAWINGS

Exemplary embodiments are illustrated in referenced figures of the drawings. It is intended that the embodiments and figures disclosed herein are to be considered illustrative rather than limiting.

Figure 5:
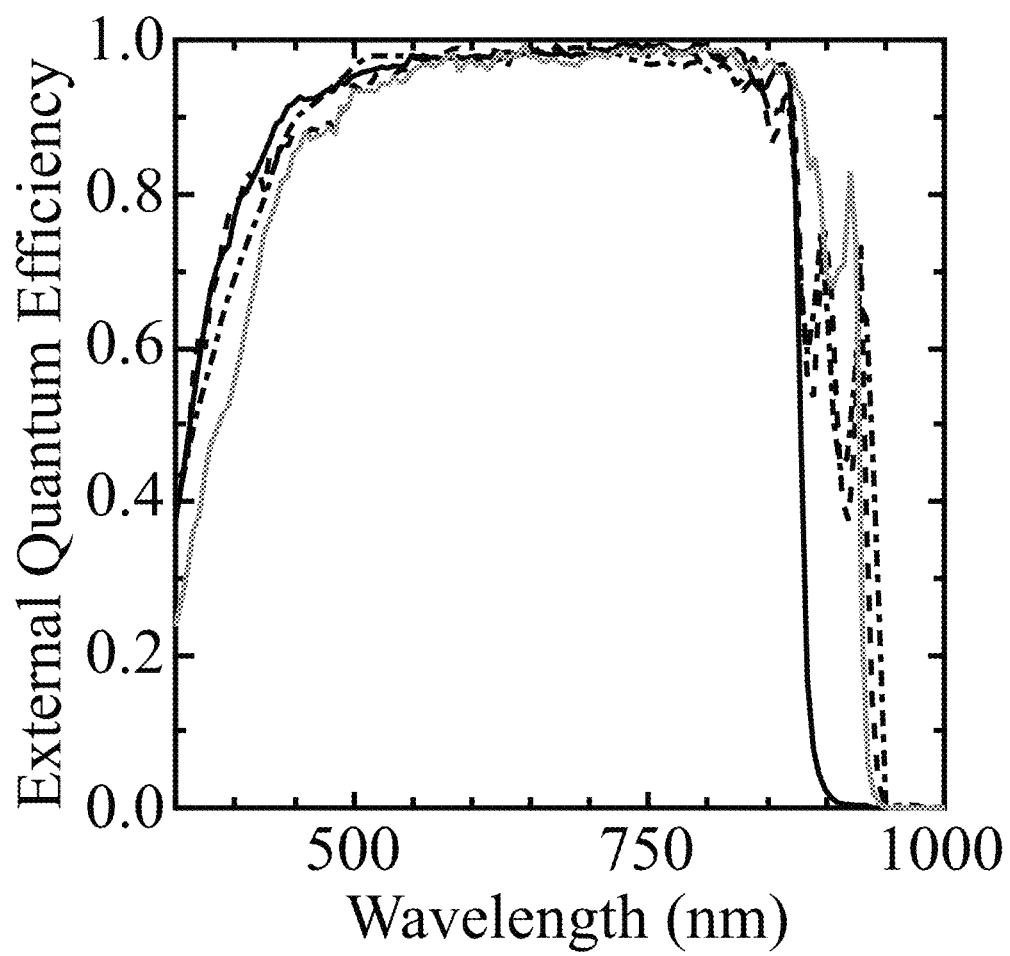

FIG. 5 illustrates the external quantum efficiency as measured for an exemplary device as described herein, according to some embodiments of the present disclosure. The curve shown with the "long dash-short dash" line type was modeled in Python, all other curves were measured. The lighter curve was measured on an upright-grown cell, with a 20-layer AlAs/GaAs distributed Bragg reflector positioned between the substrate and the device.

Figure 6:
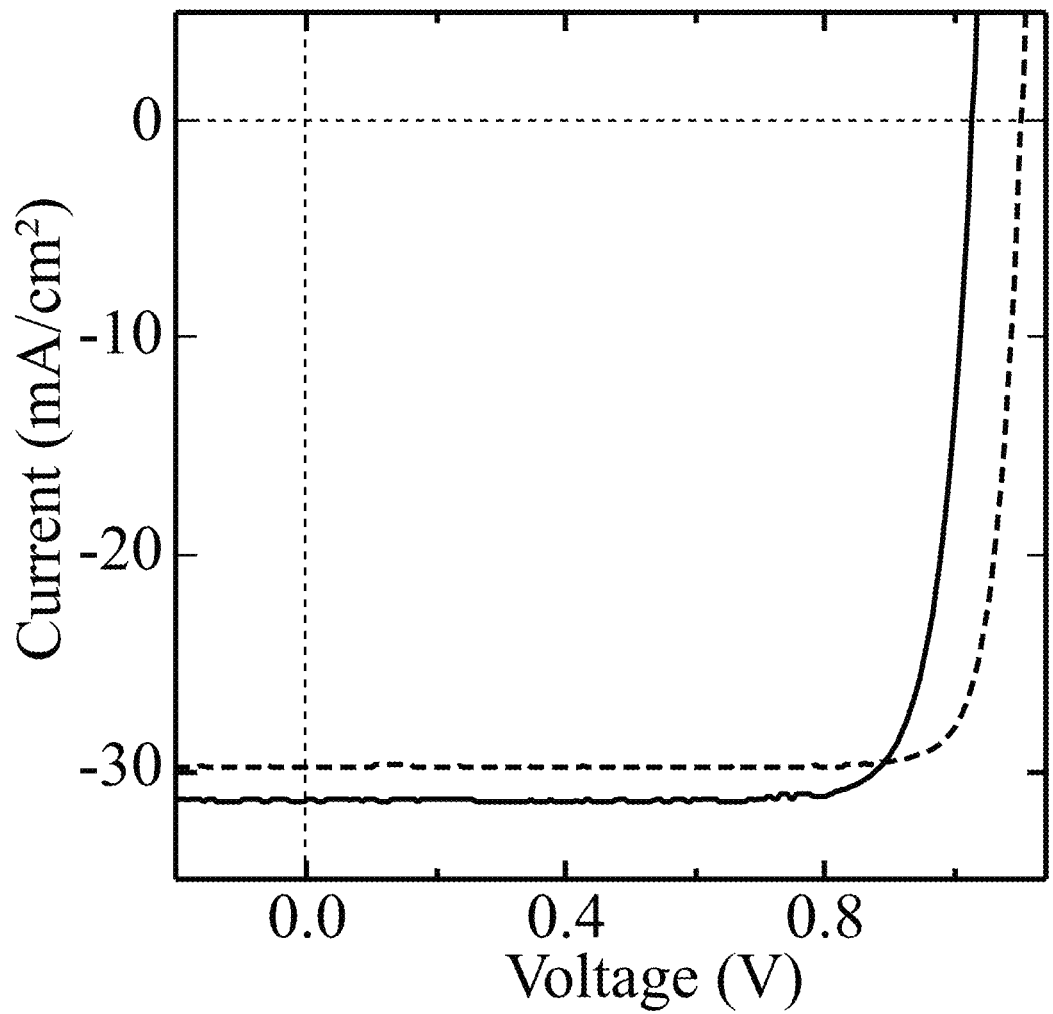

FIG. 6 illustrates current-voltage curve under a simulated AM1.5 global spectrum at 1000 W/m$^2$ for an exemplary device as described herein, according to some embodiments of the present disclosure. The cell area was 0.25 cm$^2$.

REFERENCE NUMBERS

100 . . . device or cell
110 . . . emitter layer
120 . . . quantum well
122 . . . barrier layer
125 . . . well layer
130 . . . base layer
200 . . . quantum well stack
210 . . . buffer layer
220 . . . contact layer
230 . . . window layer
240 . . . anti-reflective coating layer
250 . . . current-collecting layer

DETAILED DESCRIPTION

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to the innovation of incorporating multiple quantum wells (MQWs) into a photovoltaic device, to extend the range of photon absorption to longer wavelengths. Such devices may be used for a variety of optoelectronic applications, including (but not limited to) the conversion of sunlight into electricity, photoelectrochemical splitting of water, and detectors for broad wavelength ranges including those for optical communication. The MQWs can be lattice-matched and/or strain-balanced, but in either case the net strain may be zero with the device remaining lattice-matched to the growth substrate. In some embodiments of the present disclosure, a quantum well may include a lower bandgap material positioned between higher bandgap barriers. The absorption edge of the well depends on the bandgaps of the well and barrier materials, and the thickness of the well layer.

In some embodiments of the present disclosure, one or more quantum wells (QWs) may be incorporated into a rear-heterojunction III-V solar cell, which may result in a significant improvement in the voltage that may be generated by the solar cell. For example, traditional GaAs cells have a thin n-type emitter at the front and a thick p-type base at the back. For QW-containing solar cells, the quantum wells themselves are situated in a carrier-depleted region between these two layers. Compared to a GaAs cell having a baseline voltage between about 1.03 and about 1.05 V, incorporating quantum wells leads to a voltage in the GaAs-QW version of between about 0.95 V and about 0.97 V, corresponding to a loss of about 80 mV. However, an alternative to this is to construct solar cells with the pn junction at the back of the cell, at the heterojunction between the n-type GaAs absorber and a higher bandgap p-type GaInP-layer. This is referred to herein as a "rear heterojunction"(RHJ) and is capable of generating voltages between about 1.08 V and about 1.10 V in a structure without quantum wells. As shown herein, when the QWs were placed between the two layers of a heterojunction cell (e.g. GaAs and the GaInP), the voltage of the GaAs RHJ-QW cell increased to 1.03 V. Thus, the voltage loss relative to the corresponding baseline remained about the same. But this is surprising because the depleted region at the pn junction serves different purposes in the rear heterojunction and in the QW cell, and it is not obvious that these two functions can be combined. For the example described above, the quantum wells were strain-balanced sets of GaAsP barriers with ~10% phosphide, and GaInAs wells with ~10% indium. The thicknesses were tuned for strain-balancing.

Thus, incorporation of quantum wells may increase the range of absorption of a solar cell, which can in principle enable a higher power conversion efficiency. As shown herein, the incorporation of quantum wells between the emitter layer and the base layer results in a significant boost in the open-circuit voltages produced by III-V solar cells. This is especially important in a tandem cell where the fractional loss in voltage (due to the QWs) is lower than the fractional gain in current.

Figure 1:
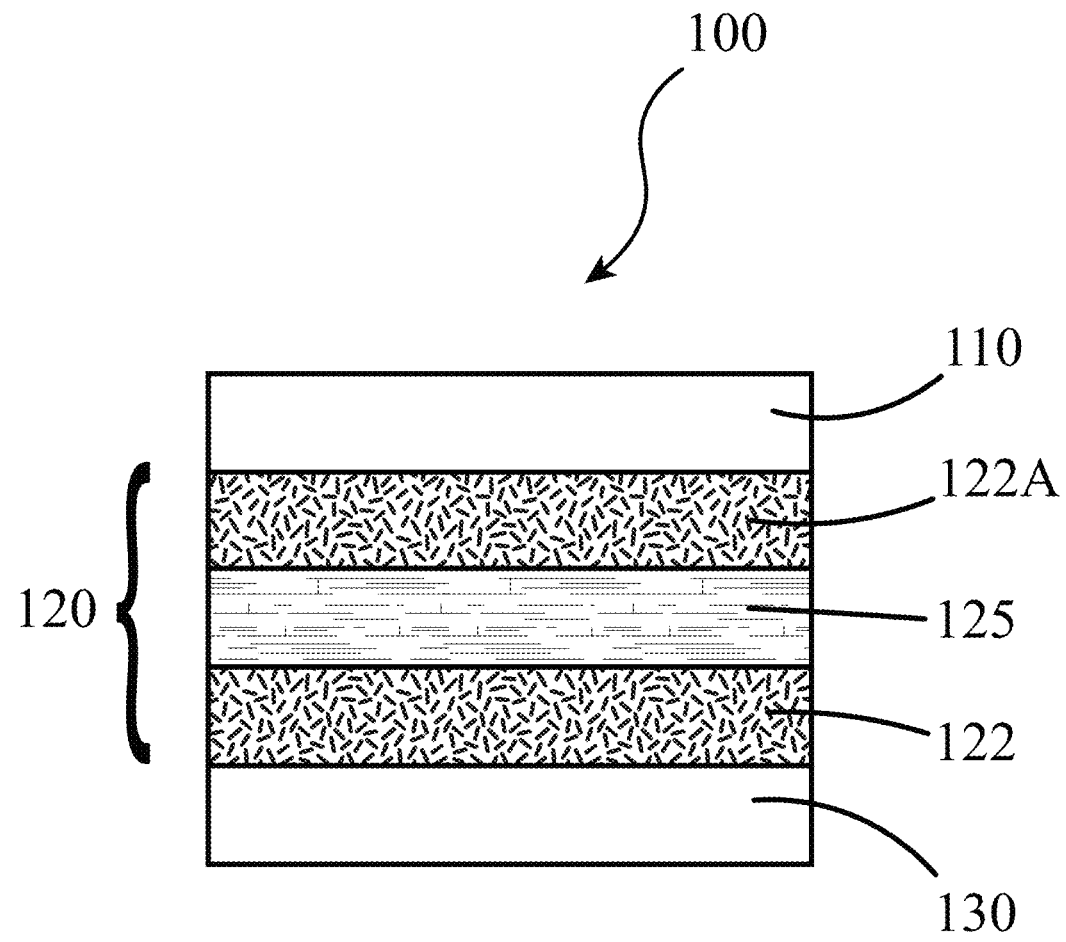
FIG. 1 illustrates a III-V-containing device, according to some embodiments of the present disclosure.

Referring to FIG. 1, a III-V-containing device 100 may include an emitter layer 110 and a base layer 130, with at least one quantum well 120 positioned between the emitter layer 110 and the base layer 130. In some embodiments, at least one of the emitter layer 110 and/or the base layer 130 may be constructed of a semiconductor alloy including at least one of GaAs, InGaAsN, GaAsSbN, GaInNAsSb, or any other suitable alloys to provide the desired bandgaps, in this case, where the emitter layer 110 has a bandgap that is different from the bandgap of the base layer 130. In general, at least one of the emitter layer 110 and/or the base layer 130 may be constructed of an AlGaInAsPNSb alloy having a first mixture of Group III elements (Al, Ga, In) combined with a second mixture of Group V elements (N, As, P, Sb). Thus, the elemental stoichiometry of the AlGaInAsPNSb alloy used for at least one of the emitter layer 110 and/or the base layer 130 may be defined as,

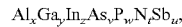

where x is between 0.0 and 1.0, y is between 0.0 and 1.0, z is between 0.0 and 1.0, v is between 0.0 and 1.0, w is between 0.0 and 1.0, t is between 0.0 and 1.0, u is between 0.0 and 1.0, and x+y+z=u+t+v+w=1.0. In some embodiments of the present disclosure, at least one of the emitter layer 110 and/or the base layer 130 may have a bandgap between about 1.0 eV to about 2.2 eV or between about 1.0 eV to about 1.5 eV. In some embodiments of the present disclosure, at least one of the emitter layer 110 and/or the base layer 130 may have a bandgap between about 1.0 eV to about 1.2 eV. In some embodiments of the present disclosure, a III-V-containing device 100 may include an emitter layer 110 and a base layer 130 (emitter layer 110/base layer 130) constructed of GaInP/AlGaInP, GaInP/AlGaAs, GaAs/AlGaInP, GaAs/GaInP, and/or GaAs/AlGaAs, GaInAs/InP.

FIG. 1 illustrates a III-V-containing device 100 having a quantum well (QW) 120, according to some embodiments of the present disclosure. As defined herein, a QW 120 is a combination of two barrier layers (122A and 122B) and a well layer 125, with the well layer 125 positioned between the two barrier layers (122A and 122B). The III-V-containing device 100 shown in FIG. 1 illustrates only one QW 120, however, some embodiments of the present disclosure may have one or more QWs 120. The barrier layers (122A and 122B) have a higher bandgap than the well layer 125. The two barrier layers (122A and 122B) are typically constructed of the same material, though they can also be constructed of different materials. The combination of the two barrier layers (122A and 122B) and the well layer 125 thickness determines the absorption properties of the quantum well structure. In some embodiments of the present disclosure, barrier layers (122A and 122B) may be constructed using an alloy of GaAsP, e.g. GaAs$_{0.9}$P$_{0.1}$, having a bandgap between 1.40 eV and 1.60 eV, e.g. about 1.53 eV, with a well layer 125 positioned between the two barrier layers, constructed using an alloy of GaInAs, e.g. Ga$_{0.89}$In$_{0.11}$As, having a bandgap between 1.20 eV and 1.40 eV, e.g. about 1.27 eV. The bandgaps of the barrier layers (122A and 122B) and the well layer 125 combine to form an effective bandgap for the quantum well 120 containing these three layers. This QW bandgap is commonly referred to as the absorption edge and also depends on the thickness of the well layer 125; e.g. a thinner well layer 125 results in more confinement and a higher bandgap. Thus, in some embodiments of the present disclosure, a QW 120 may be constructed using well layers 125 having a thickness between 5 nm and 15 nm, e.g. about 8.5 nm, and barrier layers (122A and 122B) having a thickness between 10 nm and 30 nm, e.g. about 17 nm, resulting in an adsorption edge for the QW 120 between 1.25 eV and 1.45 eV, e.g. about 1.34 eV. In some embodiments of the present disclosure, a well layer 125 of a QW 120 may be constructed using an alloy of $Ga_{1-x}In_xAs$, where x is between 0 and 0.2 inclusively with a corresponding bandgap between 1.13 and 1.4 eV. In some embodiments of the present disclosure, a barrier layer (122A and 122B) of a QW 120 may be constructed using an alloy of $GaAs_{1-y}P_y$, where y may be between 0 and 0.2 inclusively with a corresponding bandgap between 1.40 and 1.66 eV.

A quantum well 120 may be designed to have a net strain of zero so that, on average, it may be lattice-matched to the rest of layers making up the device. A QW structure (barrier layers and well layers) may be constructed of materials that have the same lattice constant as the emitter layer 110 and/or base layer 130, or QWs may be formed of lattice-mismatched materials. An example of a lattice-matched materials is GaInP, which may be used to construct both of the barrier layers (122A and 122B), and GaInAsN for the well layer 125. An example of lattice-mismatched materials is the use of GaAsP for the barrier layers (122A and 122B), and GaInAs for the well layer 125. For the case of utilizing lattice-mismatched materials, the thicknesses and compositions of the three layers (barrier layers 122A and 122B and well layers 125) are not strictly independent and should typically be chosen so that the net strain is zero (the structure is strain-balanced). The three-layer quantum well 120 structure may be grown in the depletion region between the emitter layer 110 and base layer 130 and repeated between 20 and 100 times. It is important for carrier transport that the three layers of a quantum well be depleted, and therefore the layers may be grown without any dopant. The total number of repeating quantum well 120 layers that can be grown may be determined by dividing the total width of the semiconductor depletion region (as determined by the carrier concentrations in the emitter layer 110 and the base layer 130 and the background carrier concentration in the quantum well region 120) by the thickness of the quantum well structure 120.

As described herein, a rear heterojunction architecture was applied to a device (cell) having multiple quantum wells. Because of the strongly varying potential within the wells, diffusion of carriers may immediately lead to recombination. The transport of minority carriers generated in the QWs should rather be dominated by drift in the electric field, and therefore the QWs should be situated in the depleted region between the two quasi-neutral portions of the cell. In the rear heterojunction quantum well (RHJQW) cells demonstrated here, a 1-μm n-type silicon-doped GaAs emitter 110 was grown first, with a carrier concentration of about $3E17/cm^3$. Fifty (with up to 80 demonstrated) undoped quantum wells 120 were then grown, followed by the depositing of a very thin GaAs buffer layer and then a p-type zinc-doped GaInP layer 130. The carrier concentration in the undoped QW region was estimated from a capacitance-voltage measurement to be less than $1E15/cm^3$.

Figure 2:
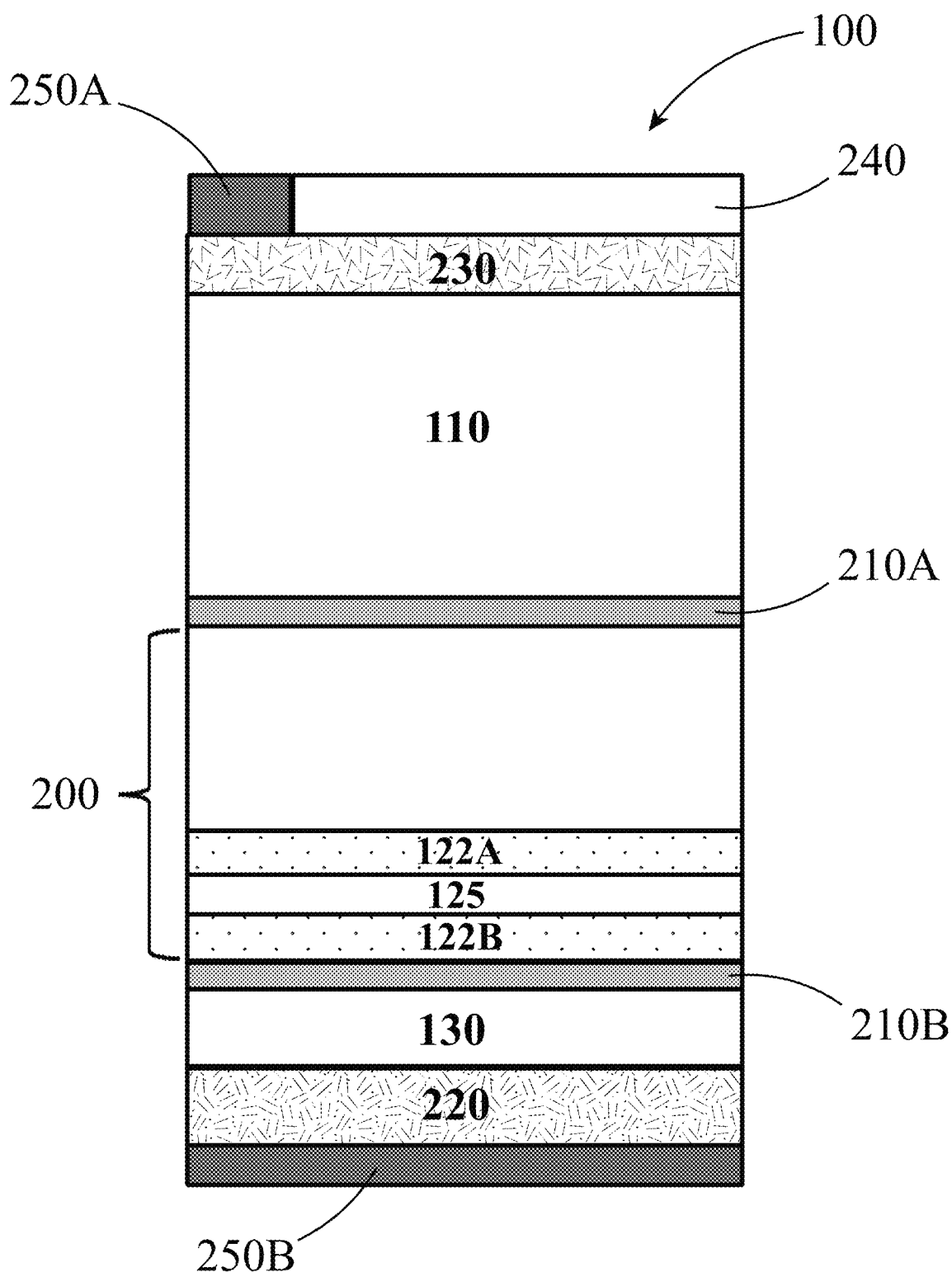
FIG. 2 illustrates a schematic of a rear heterojunction quantum well (RHJQW) cell, not to scale, according to some embodiments of the present disclosure. The growth direction may be from top to bottom.

A schematic of this exemplary device 100 is shown in FIG. 2. FIG. 2 illustrates a quantum well stack 200 that includes between one and one-hundred undoped quantum wells 120, in this particular example, 50 quantum wells. Each quantum well 120 was constructed of a GaInAs well layer 125 positioned between two GaAsP barrier layers 122A and 122B. In addition, the quantum well stack 200 is positioned between two thin, undoped buffer layers (210A and 210B) constructed of GaAs. The device 100 includes an emitter layer 110 constructed of n-type Si:GaAs and a base layer 130 constructed of p-type Zn:GaInP. The device 100 also includes a back contact layer 220 constructed of AlGaAs positioned between the base layer 130 and a metal contact layer 250B. In addition, the exemplary device 100 includes an anti-reflective coating layer 240 and a window layer 230, where the window layer 230 is positioned between the anti-reflective coating layer 240 and emitter layer 110. A first current collecting layer 250A is positioned in contact with both the window layer 230 and the anti-reflective coating layer 240 and a second current collecting layer 250B is positioned such that the back contact layer 220 is between the second current collecting layer 250B and the base layer 130. Note that the device in FIGS. 1 and 2 are not drawn to scale.

Cells were grown by atmospheric pressure metalorganic vapor phase epitaxy in a custom-built vertical reactor. Growth details are described in *Journal of Applied Physics*, Steiner, 2013, pp. 123109, which is incorporated herein by reference in its entirety. The cells were grown inverted and reoriented during processing. Briefly, a gold back contact 250B was electroplated to the AlGaAs back contact layer 220 and acts as a planar reflector behind the cell. Then, the semiconductor was bonded with epoxy to a silicon handle (not shown), the substrate was etched away, and then front contacts 250A were deposited and the devices were isolated. Finally, a bilayer ARC 240 was deposited by thermal evaporation.

The target band edge for the MQWs was 930 nm, corresponding to the broad water absorption band in the global spectrum. Each repeated unit of the QW was designed to have an 85 Å thick layer of $Ga_{0.106}In_{0.894}As$ with an 85 Å thick layers of GaAs0.9021³0.098 on each side, resulting in 170 Å thick GaAsP barriers. The GaAsP composition was calibrated by growing a series of GaAsP layers of increasing P content, with a fixed arsine ($AsH_3$) flow of 20 sccm. The solid composition was determined from high resolution reciprocal space maps of the (004) and (224) glancing exit reflections, and the data were fit to a Langmuir adsorption curve. Care was taken to control the gas switching between layers, in an attempt to form sharp interfaces between the GaAsP and GaInAs layers. The growth rates of the two layers were adjusted so that the flow rates of trimethylgallium (TMGa) source gas would match, and the arsine flow was kept constant through both layers. The trimethylindium (TMIn) and phosphine ($PH_3$) flows were stabilized in advance. The sources flows were therefore all fixed, and only the run/vent valves switched back and forth from layer to layer.

Figure 3:
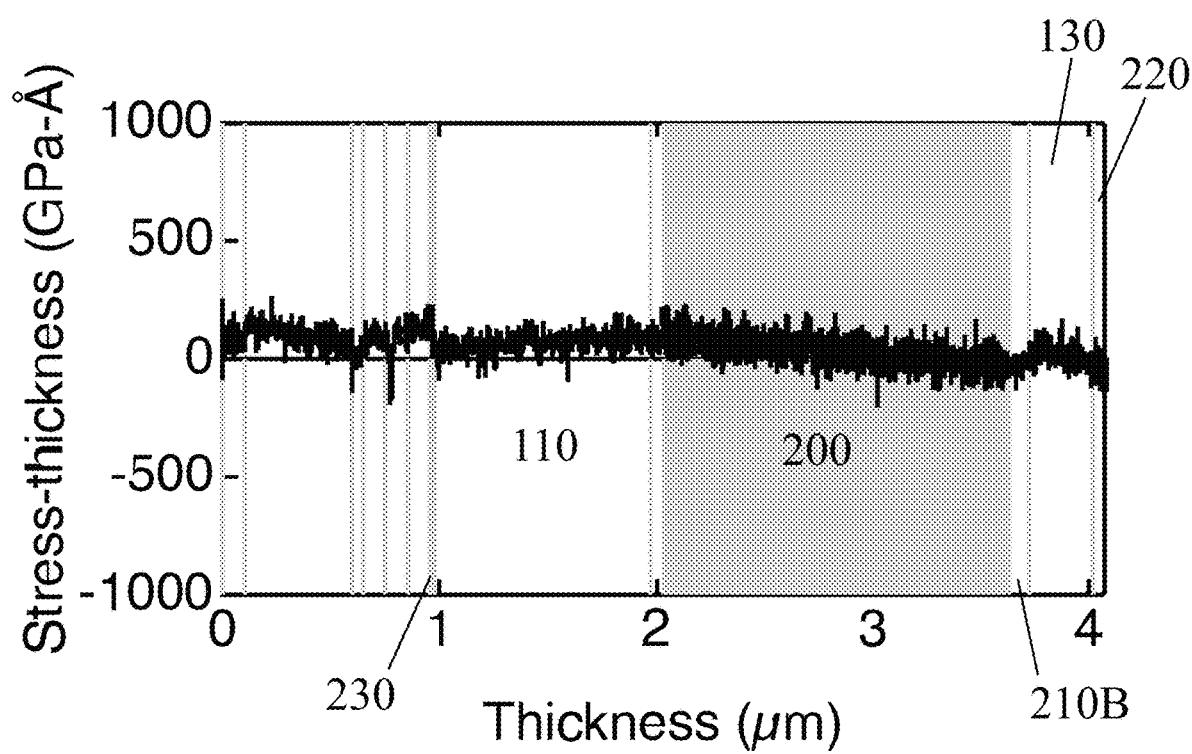
FIG. 3 illustrates, in-situ measurement of the stress-thickness of an exemplary device as described herein, according to some embodiments of the present disclosure. The substrate was 350 µm thick.

FIG. 3 shows the stress-thickness product of the sample, as measured from the in-situ curvature during growth by a k-space Multibeam Optical Stress Sensor (MOS). The net stress is determined from the overall slope of the curve, and in this sample is low despite the considerable mismatch between layers, indicating good strain-balancing. Other samples have exhibited net stress as low as 5 MPa. The data in the QW region denoted '200' are also straight rather than curved, indicating that the QW layers are not relaxing, which would lead to a significant density of dislocations. The individual layers are called out using the reference numbers defined for FIGS. 1 and 2.

Figure 4:
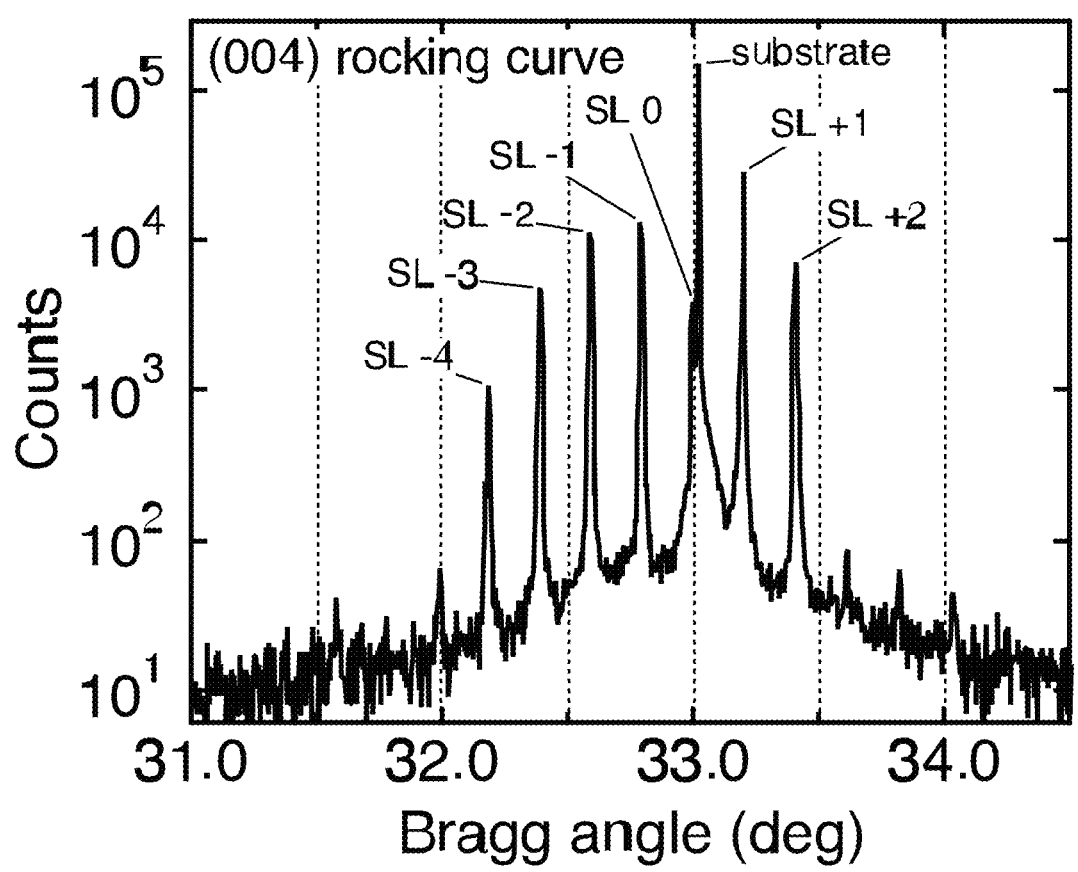
FIG. 4 illustrates, a high resolution x-ray rocking curve of the (004) reflection, with peaks as indicated, as measured for an exemplary device as described herein, according to some embodiments of the present disclosure.

FIG. 4 shows a high-resolution x-ray rocking curve of the (004) reflection. The zeroth order reflection is clearly offset from the strong substrate peak, as expected for a strain-balanced superlattice. Higher order superlattice peaks are visible on either side. The slight difference in lattice constant in the (001) direction between the two materials accounts for some of the intensity variation between peaks, but the clear asymmetry of the pattern arises from the different thicknesses of the two portions of the superlattice.

FIG. 5 shows the external quantum efficiency (EQE) for the best cell tested (dashed line), along with a baseline GaAs cell (solid dark line). Both cells had a RHJ architecture with a thick n-type emitter and a rear heterojunction with a GaInP base layer. The absorption edge is clearly extended out to 930 nm. A model of the EQE accounting for the complicated absorption characteristics of the quantum wells assuming ideal efficiency carrier collection is also shown (short dash—long dash data set). The QW absorption properties and optical model uses 10 nm barriers with a phosphide composition of about 0.885 and 11 nm wells with an indium concentration of about 0.115. The longest wavelength peak in the two dashed lines arises from the excitonic absorption in the wells. The peak at slightly shorter wavelength likely arises from the strong interference effects in the Fabry-Perot cavity of the solar cell. A traditional homojunction QW cell was also fabricated but with a carefully tuned AlAs/GaAs Bragg reflector rather than a planar gold reflector, leading to the EQE represented by the lighter solid line, with a corresponding $J_{sc}$ of about 32 mA/cm$^2$. Thus, improvements to the existing RHJQW structure are likely still possible. This graph demonstrates that the use of quantum wells increases the range of photon absorption, and therefore photocurrent, compared to the same device without quantum wells.

FIG. 6 shows the current-voltage (IV) curve for the RHJQW cell described above (solid line). The cell exhibits an open-circuit voltage $V_{oc}$=1.03 V. Compared to the $V_{oc}$ of about 1.1 V for a comparable GaAs cell without QWs (dashed line), the loss of ~70 mV corresponds simply to the shift in band edge due to the incorporation of QWs. In other words, no other sources of recombination are being introduced. Since 1.1 V indicates strong photon recycling in the absorber, the 1.03 V of the RHJQW cell similarly indicates good optoelectronic properties. With improvements to the reflector and absorption in the QW region, this cell has the potential to demonstrate efficiencies greater than 27%. In summary the RHJQW cell had the following performance metrics: $V_{oc}$=1.03 V, $J_{sc}$=31.3 mA/cm$^2$; FF=82.2%, and PCE=26.4%. The demonstrated voltage and PCE are significantly higher than the voltage and PCE of a more traditional QW cell with a thin emitter and a thick base layer.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising, in order:
   an emitter layer;
   a quantum well; and
   a base layer, wherein:
   the emitter layer has a first bandgap,
   the base layer has a second bandgap, and
   the first bandgap is different than the second bandgap by an absolute difference between about 25 meV and about 100 meV.

2. The device of claim 1, wherein the absolute difference is between about 25 meV and about 50 meV.

3. The device of claim 1, wherein the emitter layer comprises silicon- doped GaAs.

4. The device of claim 1, wherein the base layer comprises zinc-doped GaInP.

5. The device of claim 1, wherein the second bandgap is between about 1.0 eV and about 2.2 eV.

6. The device of claim 5, wherein the second bandgap is about 1.8 eV.

7. The device of claim 1, wherein the emitter layer has a thickness between about 0.5 μm and about 0.2 μm.

8. The device of claim 1, wherein the base layer has a thickness between about 0.05 μm and about 0.2 μm.

9. The device of claim 1, wherein the device comprises at least one of a solar cell, a transistor, a light-emitting diode, a laser, or a sensor.

10. The device of claim 1, wherein the first bandgap is between about 1.0 eV and about 1.5 eV.

11. The device of claim 10, wherein the first bandgap is about 1.4 eV.

12. The device of claim 1, wherein the quantum well comprises a well layer positioned between a first barrier layer and a second barrier layer.

13. The device of claim 12, wherein the well layer comprises undoped GaInAs.

14. The device of claim 12, wherein the first barrier layer and the second barrier layer.

* * * * *